(12) United States Patent
Chung et al.

(10) Patent No.: US 11,050,396 B2
(45) Date of Patent: Jun. 29, 2021

(54) AMPLIFIER CIRCUIT

(71) Applicant: Realtek Semiconductor Corp., HsinChu (TW)

(72) Inventors: Yu-Ting Chung, Taoyuan (TW); Shawn Min, Hsinchu County (TW); Yi-Chun Hsieh, Miaoli County (TW)

(73) Assignee: Realtek Semiconductor Corp., HsinChu (TW)

( * ) Notice: Subject to any disclaimer, the term of this patent is extended or adjusted under 35 U.S.C. 154(b) by 90 days.

(21) Appl. No.: 16/520,317

(22) Filed: Jul. 23, 2019

(65) Prior Publication Data
US 2020/0287508 A1    Sep. 10, 2020

(30) Foreign Application Priority Data
Mar. 8, 2019   (TW) .................................. 108107754

(51) Int. Cl.
*H03F 3/45*   (2006.01)
*H03F 3/04*   (2006.01)

(52) U.S. Cl.
CPC ............ *H03F 3/45076* (2013.01); *H03F 3/04* (2013.01); *H03F 2203/45594* (2013.01); *H03F 2203/45702* (2013.01)

(58) Field of Classification Search
CPC ............. H03F 3/45; H03F 2203/45022; H03F 2203/45026; H03F 2203/4504

USPC ........................................................ 330/258
See application file for complete search history.

(56) References Cited

U.S. PATENT DOCUMENTS

| 5,936,466 | A | 8/1999 | Andoh | |
|---|---|---|---|---|
| 7,295,067 | B2 | 11/2007 | Kamakura | |
| 2009/0108936 | A1* | 4/2009 | Forejt | H03F 3/45632 330/258 |

FOREIGN PATENT DOCUMENTS

TW         I246824        1/2006

* cited by examiner

*Primary Examiner* — Steven J Mottola
(74) *Attorney, Agent, or Firm* — Winston Hsu

(57) ABSTRACT

An amplifier circuit is provided, which includes an input stage circuit, at least one impedance component and a current supply circuit, where the input stage circuit is coupled between at least one input terminal of the amplifier circuit and at least one output terminal of the amplifier circuit, the impedance component is coupled between a first reference voltage and the output terminal, and the current supply circuit is coupled between a second reference voltage and the output terminal. The input stage circuit is arranged to generate a signal current in response to an input signal on the input terminal, and the current supply circuit is arranged to provide at least one adjustment current. In addition, a common mode voltage level of an output signal on the output terminal is controlled by the adjustment current, to allow the amplifier circuit to perform low voltage operations.

8 Claims, 8 Drawing Sheets

AMPLIFIER CIRCUIT

BACKGROUND OF THE INVENTION

1. Field of the Invention

The present invention is related to electronic circuits, and more particularly, to an amplifier circuit.

2. Description of the Prior Art

For the purpose of optimizing performance of an amplifier circuit, a bias current and output impedance must both be sufficiently large. By increasing the bias current of the amplifier circuit, a transconductance thereof can also be increased; similarly, by increasing the output impedance, amplitude of the output signal can be increased. The above method will reduce voltage headroom of one or more specific components within the amplifier circuit, however.

In the prior art, these problems are solved by increasing sizes of transistors. This may result in difficulty handling low voltage operations, however, as the operating voltage is continuously decreased. Thus, there is a need for a novel method to solve the problem of the related arts without introducing any side effect or in a way that is less likely to introduce side effects.

SUMMARY OF THE INVENTION

An objective of the present invention is to provide an amplifier circuit, where performance of the amplifier circuit can be increased without increasing sizes of transistors therein.

Another objective of the present invention is to provide an amplifier circuit which can achieve optimized performance while performing low voltage operations.

At least one embodiment of the present invention provides an amplifier circuit, wherein the amplifier circuit comprises an input stage circuit, at least one impedance component and a current supply circuit. The input stage circuit is coupled between at least one input terminal of the amplifier circuit and at least one output terminal of the amplifier circuit, said at least one impedance component is coupled between a first reference voltage and said at least one output terminal, and the current supply circuit is coupled between a second reference voltage and said at least one output terminal. In operations of the amplifier circuit, the input stage circuit is arranged to generate a signal current in response to an input signal on the input terminal, and the current supply circuit is arranged to provide at least one adjustment current. In addition, a common mode voltage level of an output signal on said at least one output terminal is controlled by said at least one adjustment current, to allow the amplifier circuit to perform low voltage operations.

The amplifier circuit of the present invention can operate under low voltages without increasing sizes of transistors therein, where the performance thereof can be maintained or improved. Thus, the present invention can solve the problems of the related arts without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
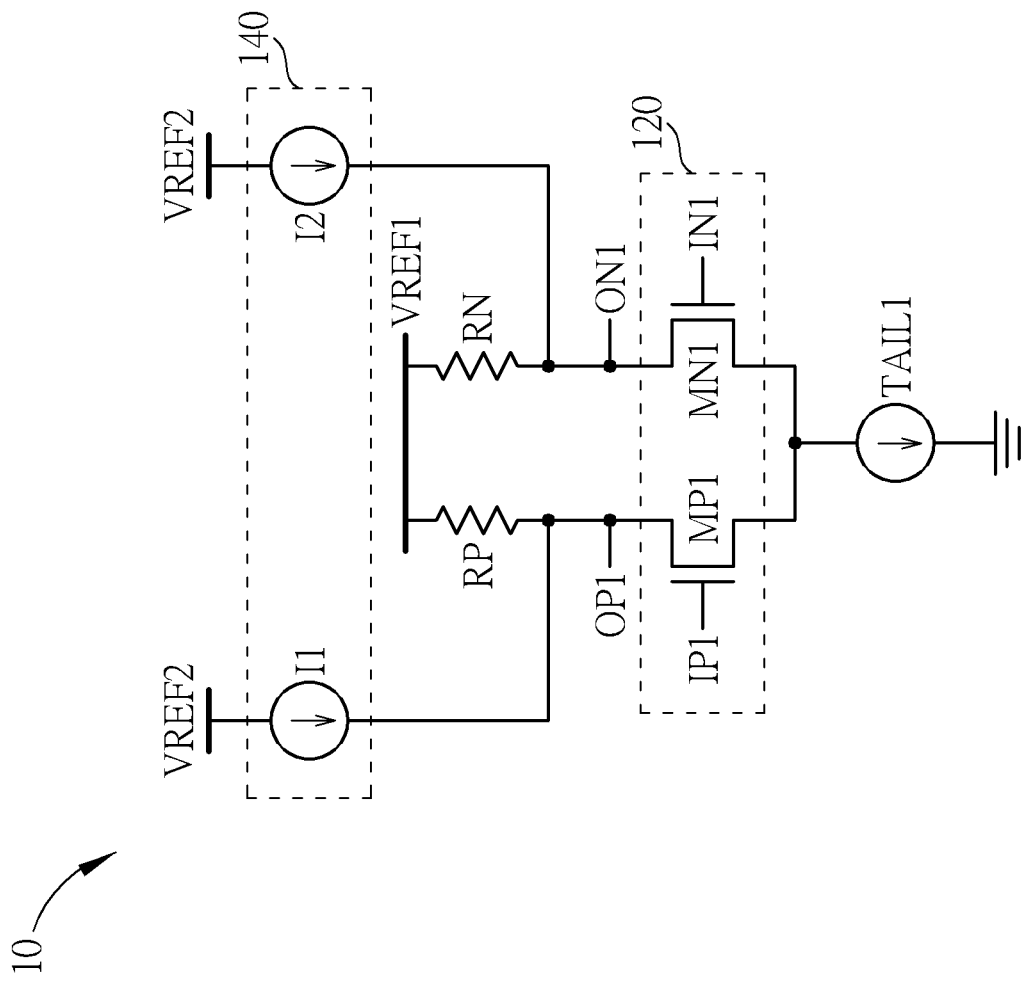
FIG. 1 is a diagram illustrating a differential amplifier circuit according to an embodiment of the present invention.

FIG. 1 is a diagram illustrating an amplifier circuit 10 according to an embodiment of the present invention. The amplifier circuit 10 comprises an input stage circuit 120, at least one impedance component, and a current supply circuit 140. In this embodiment, the aforementioned at least one impedance component may be any suitable loading component such as active components or passive components; for better comprehension, this embodiment takes resistors RP and RN as examples, but the present invention is not limited thereto. As shown in FIG. 1, the amplifier circuit 10 is a differential amplifier circuit, where the resistor RP is coupled between a reference voltage VREF1 and an output terminal OP1 of the amplifier 10, and the resistor RN is coupled between the reference voltage VREF1 and an output terminal ON1 of the amplifier circuit 10. The input stage circuit 120 may comprise at least one transistor such as transistors MP1 and MN1, where gate terminals of the transistors MP1 and MN1 are respectively coupled to input terminals IP1 and IN1 of the amplifier circuit 10 in order to receive input signals (e.g. differential input signals) of the amplifier circuit 10; source terminals of both the transistors MP1 and MN1 are coupled to a current source TAIL; and drain terminals of the transistors MP1 and MN1 are respectively coupled to the output terminals OP1 and ON1. The current supply circuit 140 may comprise at least one current source, e.g. one or more current sources such as current sources I1 and I2, where the current source I1 is coupled between a reference voltage VREF2 and the output terminal OP1, and the current source I2 is coupled between the reference voltage VREF2 and the output terminal ON1. Note that, in this embodiment, a voltage level of the reference voltage VREF2 is greater than that of the reference voltage VREF1; in other words, each of the current source I1 and I2 may be regarded as a high voltage current source. In this embodiment, the transistors MP1 and MN1 may generate a signal current in response to the differential input signals on the input terminals IP1 and IP2 respectively, and the amplifier circuit 10 may accordingly generate differential output signals such as output signals VOP1 and VON1 on the output terminals OP1 and ON1 respectively.

Figure 2:
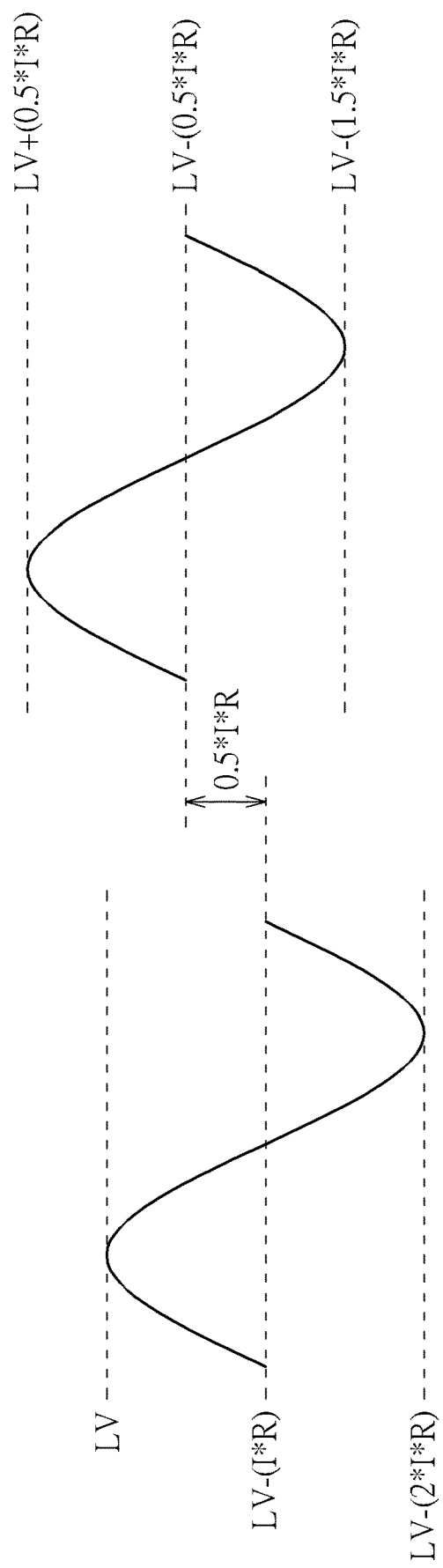
FIG. 2 is a diagram illustrating an output signal according to an embodiment of the present invention.

Refer to FIG. 2 in conjunction with FIG. 1, where FIG. 2 is a diagram illustrating the output signal VOP1 according to an embodiment of the present invention. This embodiment assumes that a current of the current source TAIL1 of the amplifier circuit 10 is designed to be 2*I, resistances of the resistors are designed to be "R", and the voltage level of the reference voltage VREF1 is designed to be "LV". If the current source I1 within the current supply circuit 140 does not generate any current (more specifically, the current supply circuit 140 is disabled), a common mode voltage level of the output signal VOP1 (e.g. a common mode voltage level of the signals VOP1 and VON1) is LV−(I*R), and a maximum voltage level and a minimum voltage level of the output signal VOP1 are LV and LV−(2*I*R) respectively (as shown in the left-half of FIG. 2). When the voltage level LV of the reference voltage VREF1 needs to be reduced for power consumption considerations, the current source I1 within the current supply circuit 140 can generate an adjustment current to control a voltage level (e.g. the common mode voltage level, the maximum voltage level and the minimum voltage level) of the output signal VOP1 in order to prevent the performance of the amplifier circuit 10 from degrading due to the voltage level LV being reduced. Assuming that the adjustment current provided by the current source I1 is "0.5*I", the common mode voltage level may be LV−(0.5*I*R), and the maximum voltage level and the minimum voltage level are LV+(0.5*I*R) and LV−(1.5*I*R) respectively (as shown in the right-half of FIG. 2).

As mentioned above, the voltage level of the output signal VOP1 is determined by the resistor RP, the signal current generated by the MP1, and the adjustment current provided by the current source I1. More particularly, the maximum voltage level occurs in a situation where the signal current generated by the transistor MP1 is zero (i.e. the transistor MP1 is turned off), so the adjustment current provided by the current source I1 may flow to the resistor RP rather than the transistor MP1. This makes the voltage level of the output signal VOP1 greater than the voltage level LV of the reference voltage VREF1, i.e. the current supply circuit 140 makes the voltage level of the output signal VOP1 of the amplifier circuit 10 unlimited by the voltage level LV of the reference voltage VREF1. Since the output signals VOP1 and VON1 area set of differential output signals of the amplifier circuit 10, those skilled in the art should understand the relationship between voltage levels of the signal VON1 and VOP1, and related details of the output signal VON1 are therefore omitted for brevity.

Figure 3:
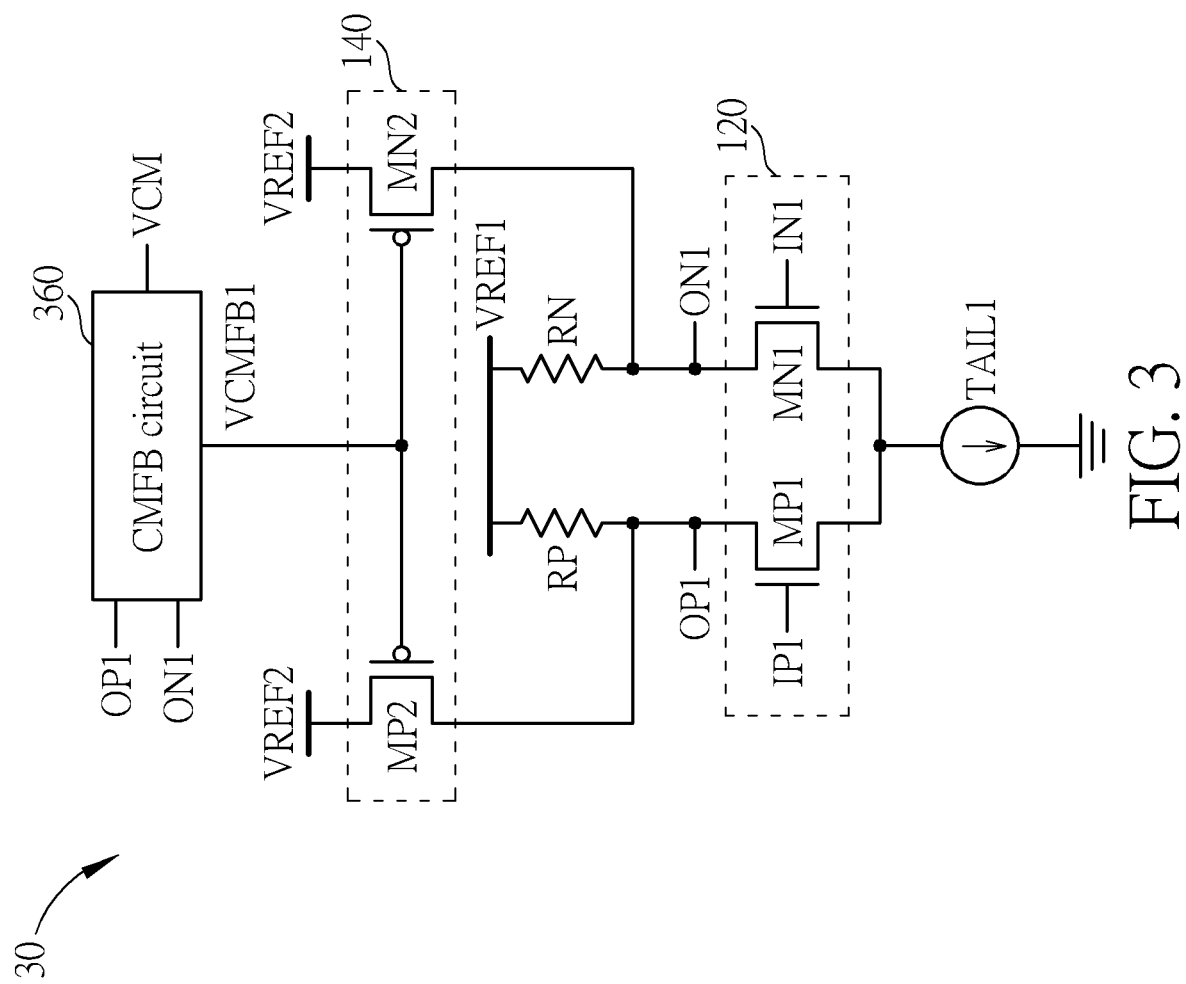
FIG. 3 is a diagram illustrating a differential amplifier circuit having a common mode feedback (CMFB) circuit according to an embodiment of the present invention.

FIG. 3 is a diagram illustrating an amplifier circuit 30 according to an embodiment of the present invention. In comparison with the amplifier circuit 10 shown in FIG. 1, the amplifier circuit 30 may further comprise a common mode feedback (CMFB) circuit 360, where the CMFB circuit 360 may be coupled to the output terminals OP1 and ON1, a reference voltage VCM and the current supply circuit 140. In this embodiment, the current sources I1 and I2 may be implemented by transistors MP2 and MN2, where the CMFB circuit 360 utilizes a control terminal coupled to gate terminals of the transistors MP2 and MN2 to transmit a control signal VCMFB1, and the aforementioned adjustment current (e.g. a magnitude of the aforementioned adjustment current) is controlled by a voltage level of the control signal VCMFB1.

In this embodiment, the CMFB circuit 360 can detect the voltage levels of the output signals VOP1 and VON1 in order to obtain the common mode voltage level of the output signals VOP1 and VON1, where the common mode voltage level is an average of the output signals VOP1 and VON1. The CMFB circuit 360 can compare the common mode voltage level with a voltage level of the reference voltage VCM to generate a comparison result, and modify the aforementioned at least one adjustment current according to the comparison result. Assume that the voltage level of the reference voltage VCM is 0.8 V, I=1 mA (where the current of the current source TAIL1 is designed to be 2 mA), and R=200 ohms (Ω). If the voltage level LV of the reference voltage VREF1 is not less than 1 V, the CMFB circuit 360 may detect that the common mode voltage level of the output signals VOP1 and VON1 is not less than 0.8 V and therefore disable the current supply circuit 140 through the control signal VCMFB1. If the voltage level LV of the reference voltage VREF1 is less than 1 V (e.g. 0.9 V), the common mode voltage level may be reduced to 0.7 V, and the CMFB circuit may detect that the common mode voltage level is less than 0.8 V and therefore enable the current supply circuit 140 to control each of the transistors MP2 and MN2 to provide a high voltage current (e.g. an adjustment current of 0.5 mA) through the control signal VCMFB. As a result, the current flowing through each of the resistors RP and RN may be reduced to 0.5 mA from 1 mA, and the common mode voltage level may be increased to 0.8 V from 0.7 V, which guarantees that components (such as the transistors MP1 and MN1, and component(s) within the current source TAIL) within the amplifier circuit 30 have sufficient voltage headroom. For example, the CMFB circuit 360 may comprise two resistors (having the same resistance) connected in series, which are coupled between the output terminals OP1 and ON1 and are arranged to perform an average operation on the output signals VOP1 and VON1 in order to generate the average on the terminal between these two resistors (e.g. the connected node of these two resistors). The CMFB circuit 360 may further comprise a comparator coupled to this terminal in order to compare the common mode voltage level with the voltage level of the reference voltage VCM to generate the comparison result for modifying the aforementioned at least one adjustment current, but the present invention is not limited thereto. After reading the above embodiments, those skilled in the art should understand the detailed implementation of the CMFB circuit, and related detail is omitted for brevity.

Figure 4:
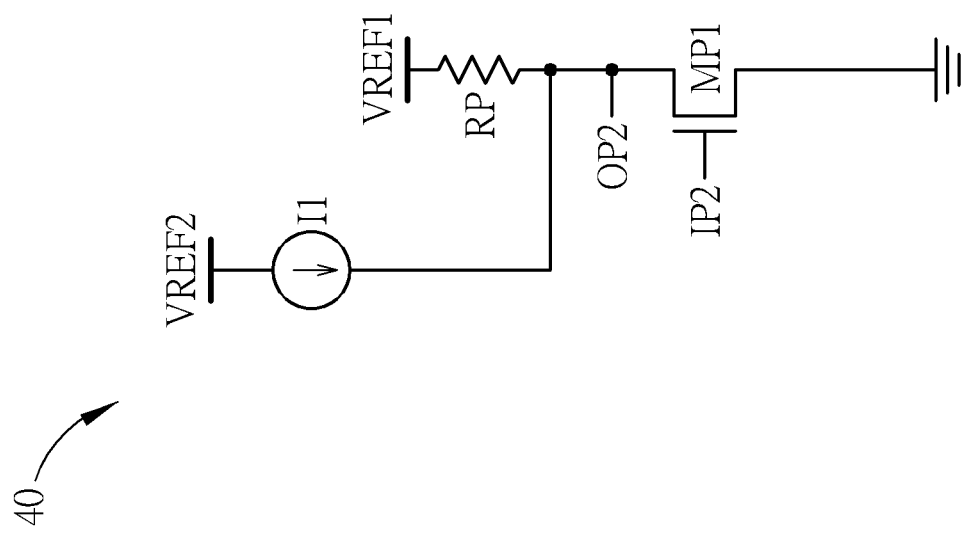
FIG. 4 is a diagram illustrating a single-ended amplifier circuit according to an embodiment of the present invention.

FIG. 4 is a diagram illustrating an amplifier circuit 40 according to an embodiment of the present invention. The amplifier circuit 40 is a single-ended amplifier circuit which is modified based on the amplifier circuit 10 shown in FIG. 1, where the amplifier circuit 40 comprises an input terminal IP2 and an output terminal OP2, and the architecture of the amplifier circuit 40 is similar to the left-half (or the right-half) of the amplifier circuit 10; the difference thereof is that the source terminal of the transistor MP1 within the amplifier circuit 40 is coupled to a fixed reference voltage (e.g. a ground voltage) rather than the current source TAIL1. After reading the operations of the amplifier circuit 10, those skilled in the art should understand detailed implementation of the amplifier circuit 40, and related detail is omitted for brevity.

Figure 5:
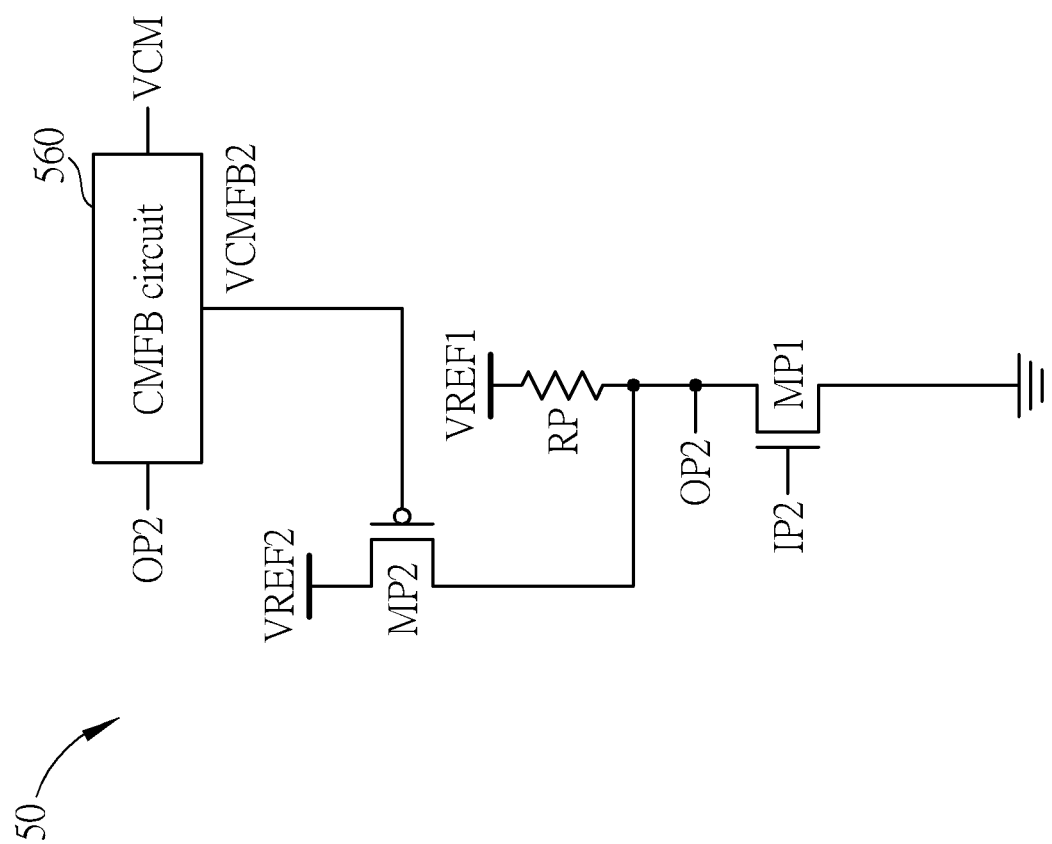
FIG. 5 is a diagram illustrating a single-ended amplifier circuit having a CMFB circuit according to an embodiment of the present invention.
Figure 8:
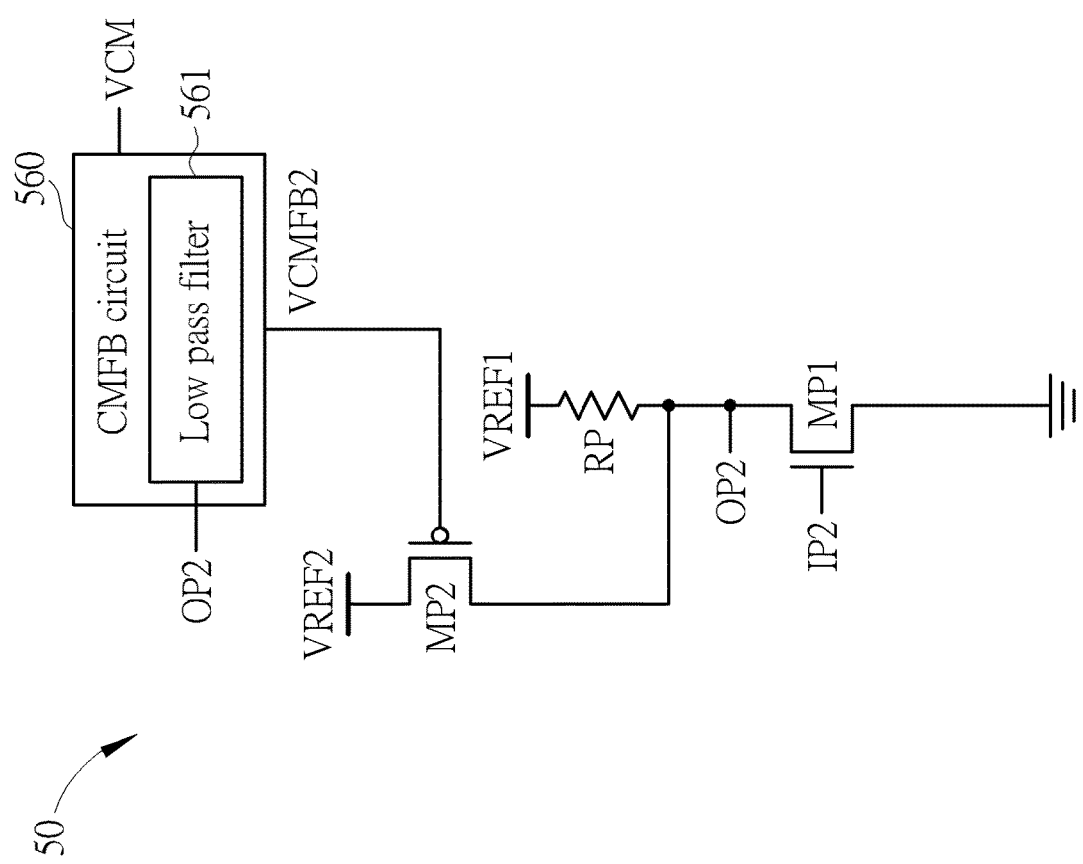
FIG. 8 is a diagram illustrating a single-ended amplifier circuit having a CMFB circuit according to another embodiment of the present invention.

FIG. 5 is a diagram illustrating an amplifier circuit 50 according to an embodiment of the present invention. In comparison with the amplifier circuit 40 shown in FIG. 4, the amplifier circuit 50 may further comprise a CMFB circuit 560. Similar to the CMFB circuit 360 shown in FIG. 3, the CMFB circuit 560 can detect a common mode voltage level of an output signal VOP2 on the output terminal OP2, to dynamically modify the common mode voltage of the output signal VOP2 of the amplifier circuit 50 in response to variation in the voltage level LV of the reference voltage VREF1. In order to obtain the common mode voltage level of the output signal VOP2, the CMFB circuit 560 may comprise a low-pass filter 561 coupled to the output terminal OP2 to receive the output signal VOP2 and generate the common mode voltage level of the output signal VOP2 as shown in FIG. 8, where the low pass filter 561 may replace the aforementioned two resistors within the CMFB circuit 360, and the comparator may be coupled to an output terminal of the low pass filter 561. For example, the low pass filter 561 can remove an alternating current (AC) signal within the output signal VOP2 to obtain a direct current (DC) signal within the output signal VOP2, and the comparator can compare the DC signal with the reference voltage VCM, and accordingly generate a control signal VCMFB2 to control the current source I1 (e.g. the transistor MP2), but the present invention is not limited thereto.

Note that the architectures of the amplifier circuits 10, 30, 40 and 50 are for illustrative purposes only, and are not limitations of the present invention. The amplifier circuits 10, 30, 40 and 50 utilize N-type transistors (such as the transistors MP1 and MN1) for receiving the input signals, and amplifier circuits 60 and 70 respectively shown in FIGS. 6 and 7 utilize P-type transistors for receiving the input signals (e.g. gate terminals of transistors MP3 and MN3 are respectively coupled to input terminals IP3 and IN3 of the amplifier circuit 60), but the present invention is not limited thereto.

Figure 6:
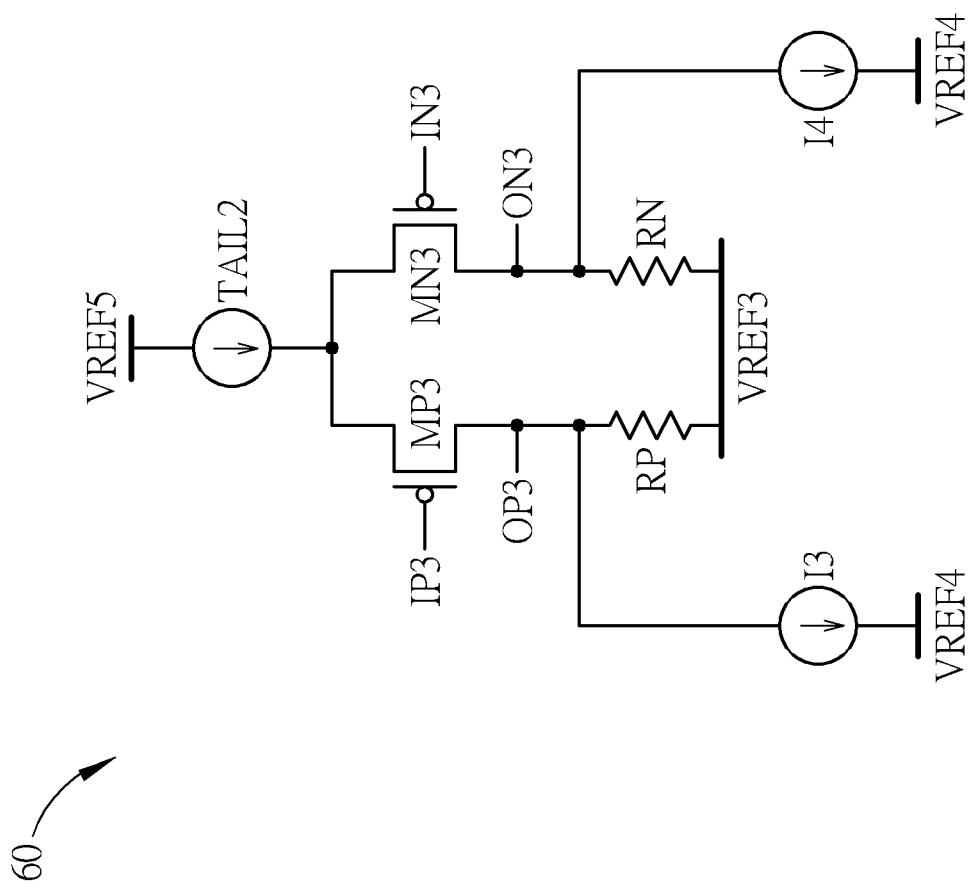
FIG. 6 is a diagram illustrating a differential amplifier circuit according to an embodiment of the present invention.
Figure 7:
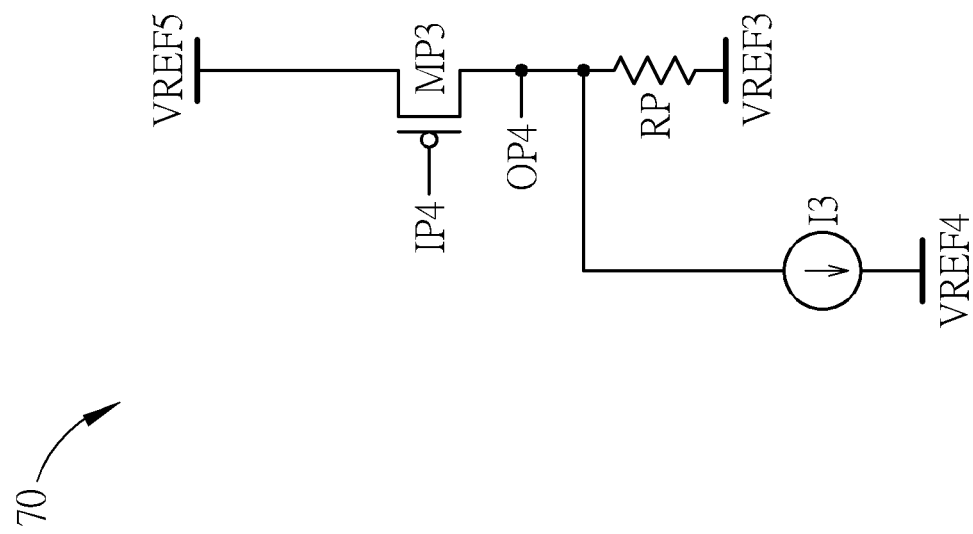
FIG. 7 is a diagram illustrating a single-ended amplifier circuit according to an embodiment of the present invention.

In the embodiment of FIG. 6, a voltage level of the reference voltage VREF4 is lower than that of the reference voltage VREF3, so each of the current sources I3 and I4 may be regarded as a low voltage current source. For example, when a voltage level of the reference voltage VREF5 needs to be reduced for power consumption considerations, the amplifier circuit 60 can reduce a common mode voltage level of the output signals VOP3 (which is on the output terminal OP3) and VON3 (which is on the output terminal ON3) with the aid of current sources I3 and I4, in order to prevent the performance of the amplifier circuit 60 from degrading due to insufficient voltage headroom of components within the amplifier circuit 60 (such as a tail current TAIL2 and the transistors MP3 and MN3). In addition, voltage levels of the output signals VOP3 and VON3 are not limited by the voltage level of the reference voltage VREF3. The amplifier circuit 60 may further comprise a CMFB circuit (not shown) to perform operations similar to that shown in FIG. 3. For example, this CMFB circuit may comprise two resistors (having the same resistance) connected in series, which are coupled between the output terminals OP3 and ON3 and are arranged to perform an average operation on the output signals VOP3 and VON3 in order to generate the average on the terminal between these two resistors (e.g. the connected node of these two resistors). The CMFB circuit 360 may further comprise a comparator coupled to this terminal in order to compare the common mode voltage level in this embodiment with the voltage level of the reference voltage VCM to generate the comparison result for modifying the aforementioned at least one adjustment current, but the present invention is not limited thereto. After reading the above descriptions, those skilled in the art should understand the detailed implementation of applying the CMFB mechanism (mentioned in the embodiment of FIG. 3) to the amplifier circuit 60; related detail is omitted for brevity.

In addition, the amplifier circuit 70 is a single-ended amplifier circuit which is modified based on the amplifier circuit 60 shown in FIG. 6. The amplifier circuit 60 comprises an input terminal IP4 and an output terminal OP4, and the architecture of the amplifier circuit 70 is similar to the left-half (or the right-half) of the amplifier circuit 60, and the difference thereof is that the source terminal of the transistor MP3 within the amplifier circuit 70 is coupled to a fixed reference voltage (e.g. the reference voltage VREF5) rather than the current source TAIL2. Similar to the amplifier circuit 60, the amplifier circuit 70 can reduce a voltage level of an output signal VOP4 of the amplifier circuit 70 with the aid of current source I3, and the voltage level of the output signal VOP4 is not limited by the voltage level of the reference voltage VREF3. In addition, the amplifier circuit 70 may further comprise a CMFB circuit (not shown) to perform operations similar to that of the embodiment shown in FIG. 5. After reading the above descriptions, those skilled in the art should understand detailed implementations of applying the CMFB mechanism (mentioned in the embodiment of FIG. 5) to the amplifier circuit 70; related detail is omitted for brevity.

Briefly summarized, the present invention configures an additional high voltage (or low voltage) current source in an amplifier circuit to inject (or extract) an adjustment current regarding an output terminal of the amplifier circuit in order to allow the amplifier circuit to perform low voltage operations. When a voltage level of a reference voltage of the amplifier circuit is reduced, the adjustment current can avoid problems caused to components within the amplifier circuit due to the reduced voltage level of an output signal on the output terminal, such as insufficient voltage headroom. Since the adjustment current is provided by a high voltage (or a low voltage), the voltage level of the output signal is not limited by the voltage level of the reference voltage. In addition, the amplifier circuit of the present invention is not limited to the architecture of any of the amplifier circuits 10, 30, 40, 50, 60 and 70; any amplifier circuit modifying a voltage level of an output signal of the amplifier circuit by injecting (or extracting) an adjustment current regarding an output terminal of the amplifier circuit should belong to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
an input stage circuit, coupled between at least one input terminal of the amplifier circuit and at least one output terminal of the amplifier circuit, wherein the input stage circuit is arranged to generate a signal current in response to an input signal on the input terminal;
at least one impedance component, coupled between a first reference voltage and said at least one output terminal; and
a current supply circuit, coupled between a second reference voltage and said at least one output terminal, arranged to provide at least one adjustment current;
wherein a common mode voltage level of an output signal on said at least one output terminal is controlled by said at least one adjustment current, to allow the amplifier circuit to perform low voltage operations, a voltage level of the output signal is determined by said at least one impedance component, the signal current and said at least one adjustment current, and a maximum voltage level or a minimum voltage level of the output signal is not limited to a voltage level of the first reference voltage.

2. The amplifier circuit of claim 1, wherein the input stage circuit comprises at least one transistor, and the input signal is received by a gate terminal of said at least one transistor.

3. The amplifier circuit of claim 1, wherein the current supply circuit comprises at least one transistor, and said at least one adjustment current is controlled by a voltage level of a gate terminal of said at least one transistor.

4. The amplifier circuit of claim 1, further comprising:
a common mode feedback circuit, coupled between said at least one output terminal and the current supply circuit, wherein the common mode feedback circuit compares the common mode voltage level of the output signal with a reference voltage level to generate a comparison result, and modifies said at least one adjustment current according to the comparison result.

5. The amplifier circuit of claim 4, wherein the amplifier circuit is a differential amplifier, and the output signal is a differential output signal within a set of differential output signals.

6. The amplifier circuit of claim 5, wherein the common mode voltage level of the output signal is an average of the set of differential output signals.

7. An amplifier circuit, comprising:
an input stage circuit, coupled between at least one input terminal of the amplifier circuit and at least one output terminal of the amplifier circuit, wherein the input stage circuit is arranged to generate a signal current in response to an input signal on the input terminal;
at least one impedance component, coupled between a first reference voltage and said at least one output terminal; and
a current supply circuit, coupled between a second reference voltage and said at least one output terminal, arranged to provide at least one adjustment current;
wherein a common mode voltage level of an output signal on said at least one output terminal is controlled by said at least one adjustment current, to allow the amplifier circuit to perform low voltage operations, and the amplifier circuit further comprises:
a common mode feedback circuit, coupled between said at least one output terminal and the current supply circuit, wherein the common mode feedback circuit compares the common mode voltage level of the output signal with a reference voltage level to generate a comparison result, and modifies said at least one adjustment current according to the comparison result;
wherein the amplifier circuit is a single-ended amplifier, and the output signal is a single-ended output signal of the single-ended amplifier.

8. The amplifier circuit of claim 7, wherein the common mode feedback circuit comprises:
a low pass filter, coupled to said at least one output terminal, configured to receive the single-ended output signal to generate the common mode voltage level of the output signal.

* * * * *